United States Patent
Tang et al.

(10) Patent No.: US 9,846,461 B2
(45) Date of Patent: Dec. 19, 2017

(54) HEAT DISSIPATING APPARATUS AND ELECTRONIC DEVICE

(71) Applicant: Delta Electronics, Inc., Taoyuan Hsien (TW)

(72) Inventors: Chung-Hung Tang, Taoyuan Hsien (TW); Shih-Chou Chen, Taoyuan Hsien (TW); Chun-Lung Chiu, Taoyuan Hsien (TW); Chao-Wen Lu, Taoyuan Hsien (TW); Chun-Nan Lin, Taoyuan Hsien (TW); Fu-Mei Hsu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 131 days.

(21) Appl. No.: 14/175,368

(22) Filed: Feb. 7, 2014

(65) Prior Publication Data

US 2014/0226282 A1    Aug. 14, 2014

Related U.S. Application Data

(60) Provisional application No. 61/762,714, filed on Feb. 8, 2013.

(30) Foreign Application Priority Data

Oct. 8, 2013    (CN) .......................... 2013 1 0465819

(51) Int. Cl.
*H05K 7/20*    (2006.01)
*G06F 1/20*    (2006.01)

(52) U.S. Cl.
CPC ......... *G06F 1/203* (2013.01); *H05K 7/20172* (2013.01)

(58) Field of Classification Search
None
See application file for complete search history.

(56) References Cited

U.S. PATENT DOCUMENTS

| | | | | |
|---|---|---|---|---|
| 7,726,974 B2 * | 6/2010 | Shah | ...................... | G05B 15/02 439/40 |
| 2001/0017923 A1 * | 8/2001 | Suzuki | ..................... | H04R 1/20 381/150 |
| 2006/0050482 A1 | 3/2006 | Glezer et al. | | |
| 2007/0098207 A1 * | 5/2007 | Lin | .......................... | H04R 7/06 381/399 |
| 2013/0044501 A1 * | 2/2013 | Rudisill | ................ | F21V 29/004 362/398 |

* cited by examiner

*Primary Examiner* — Courtney Smith
(74) *Attorney, Agent, or Firm* — Muncy, Geissler, Olds & Lowe, P.C.

(57) ABSTRACT

A heat dissipating apparatus includes a frame, an elastic body, a magnetic member and a coil. The frame has an opening. The elastic body is disposed on the frame, and the frame and the elastic body define a space. The magnetic member is located corresponding to the space and disposed at one side of the elastic body. The coil is located corresponding to the periphery of the space and disposed on the frame. An electronic device with the heat dissipating apparatus is also disclosed.

25 Claims, 14 Drawing Sheets

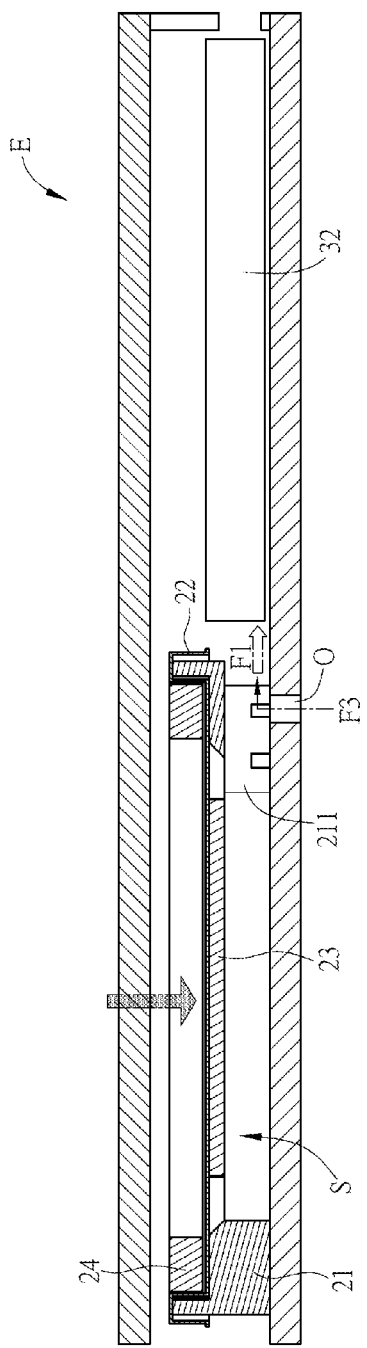
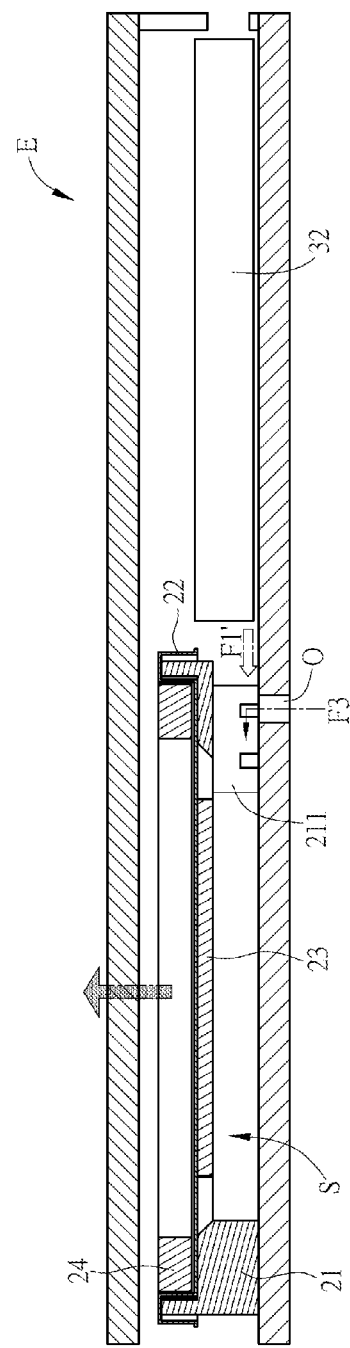
FIG. 7A
FIG. 7B

HEAT DISSIPATING APPARATUS AND ELECTRONIC DEVICE

CROSS REFERENCE TO RELATED APPLICATIONS

This Non-provisional application claims priorities of U.S. provisional Patent Application No. 61/762,714 filed on Feb. 8, 2013, and Patent Application No. 201310465819.0 filed in People's Republic of China on Oct. 8, 2013, the entire contents of which are hereby incorporated by reference.

BACKGROUND OF THE INVENTION

Field of Invention

The present invention relates to a heating dissipating apparatus.

Related Art

As the progress of information and technology, various kinds of electronic apparatuses or devices have been developed toward smaller size and lighter weight. In general, the processor of electronic device will generate heat during operation. The common desktop computer or laptop computer usually uses a fan for active heat dissipation. On the contrary, the small-sized tablet computer is usually equipped with a simpler processor, which has lower performance and thus generates much less heat. Accordingly, the tablet computer can dissipate the heat generated from the processor by a passive approach such as a heat sink or a heat pipe. Otherwise, a thin fan is applied to the small-sized electronic device for heat dissipation. Unfortunately, the fan still has the noise issue.

Except the common fans, the jet cooling is also an applicable heat dissipation solution for small-sized devices. The jet cooling technology utilizes the vibration to cause airflow instead of a rotating impeller. FIG. 1 is a schematic diagram showing a conventional jet cooling structure. As shown in FIG. 1, the main body of the cooling structure 1 is a hollow frame 11, and a film 12 is disposed within the frame 11 to form a hollow chamber. In addition, a magnetic member 13 is disposed at the center of the bottom of the frame 11, and a coil 14 is provided on the film 12 and located corresponding to the magnetic member 13.

The coil 14 is driven by a piezoelectric driver to induce the vertical vibration of the film 12. Accordingly, air can be introduced into the chamber and then flows out from the chamber as the film 12 vibrates. The airflow can cause a vortex so as to enhance the air convection.

However, since the coil 14 of the cooling structure 1 is directly disposed on the film 12 and moves along with the vibrated film 12, the circuitry of the coil 14 may be easily damaged. In addition, the magnetic member 13 and the coil 14 are vertically arranged, and this arrangement is not suitable for the minimization of the cooling structure 1.

SUMMARY OF THE INVENTION

In view of the foregoing subject, an objective of the present invention is to provide a heat dissipating apparatus applicable to small-sized electronic devices and capable of reducing noise and minimizing the damage thereof.

To achieve the above objective, the present invention discloses a heat dissipating apparatus including a frame, an elastic body, a magnetic member and a coil. The frame has an opening. The elastic body is disposed on the frame, and the frame and the elastic body define a space. The magnetic member is located corresponding to the space and disposed at one side of the elastic body. The coil is located corresponding to the periphery of the space and disposed on the frame.

In one embodiment, the magnetic member and the coil are disposed at the same side or different sides of the elastic body.

In one embodiment, the frame has at least one channel connecting to the opening.

In one embodiment, the heat dissipating apparatus further includes a weighting member disposed on the magnetic member.

In one embodiment, the elastic member comprises a composite material.

In one embodiment, the elastic member is disposed between the frame and the coil.

In one embodiment, the frame has a recess, and the coil is disposed in the recess.

In one embodiment, the frame has a protruding portion, and the elastic member has a concave portion fitting to the protruding portion.

In one embodiment, the heat dissipating apparatus further includes a fixing member for fixing the elastic member on the frame.

To achieve the above objective, the present invention also discloses another heat dissipating apparatus including a frame, an elastic body, a magnetic member and at least a coil. The frame includes an outer frame and a frame body disposed in the outer frame. The frame body has an opening. The elastic body is disposed on the frame, and the frame body and the elastic body define a space. The magnetic member is located corresponding to the space and disposed at one side of the elastic body. The coil is located corresponding to the space and disposed at one side of the magnetic member.

To achieve the above objective, the present invention further discloses an electronic device including a heating device and a heat dissipating apparatus disposed around the heating device. The heat dissipating apparatus includes a frame, an elastic body, a magnetic member and a coil. The frame has an opening. The elastic body is disposed on the frame, and the frame and the elastic body define a space. The magnetic member is located corresponding to the space and disposed at one side of the elastic body. The coil is located corresponding to the periphery of the space and disposed on the frame.

As mentioned above, the magnetic member and coil of the heat dissipating apparatus of the invention are arranged alternately, so that the heat dissipating apparatus can be sufficiently flattened and minimized. Besides, the present invention can adjust the voltage value or current frequency to output signal with specific waveform to the coil according to the space and desired airflow, thereby inducing the magnetic member to drive the elastic body with various amplitudes for generating different airflows. Since the invention utilizes electrical signal to generate desired airflow, the undesired noise can be avoided. Moreover, the vibration point is directly activated, so the power consumption can be minimized. That is, the elastic body and magnetic member can be motivated by smaller voltage or current (lower power consumption).

BRIEF DESCRIPTION OF THE DRAWINGS

The present invention will become more fully understood from the subsequent detailed description and accompanying drawings, which are given by way of illustration only, and thus are not limitative of the present invention, and wherein:

FIGS. 7A and 7B are schematic diagrams showing another aspect of the heat dissipating apparatus of FIG. 4 applied to further another type of the electronic device;

DETAILED DESCRIPTION OF THE INVENTION

The present invention will be apparent from the following detailed description, which proceeds with reference to the accompanying drawings, wherein the same references relate to the same elements.

Figure 1:
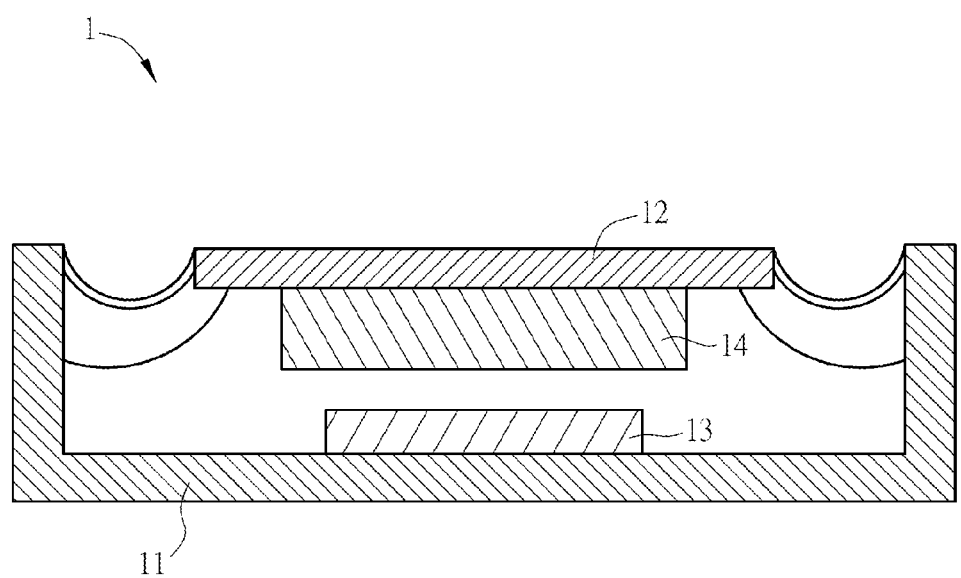
FIG. 1 is a schematic diagram showing a conventional jet cooling structure.
Figure 2A:
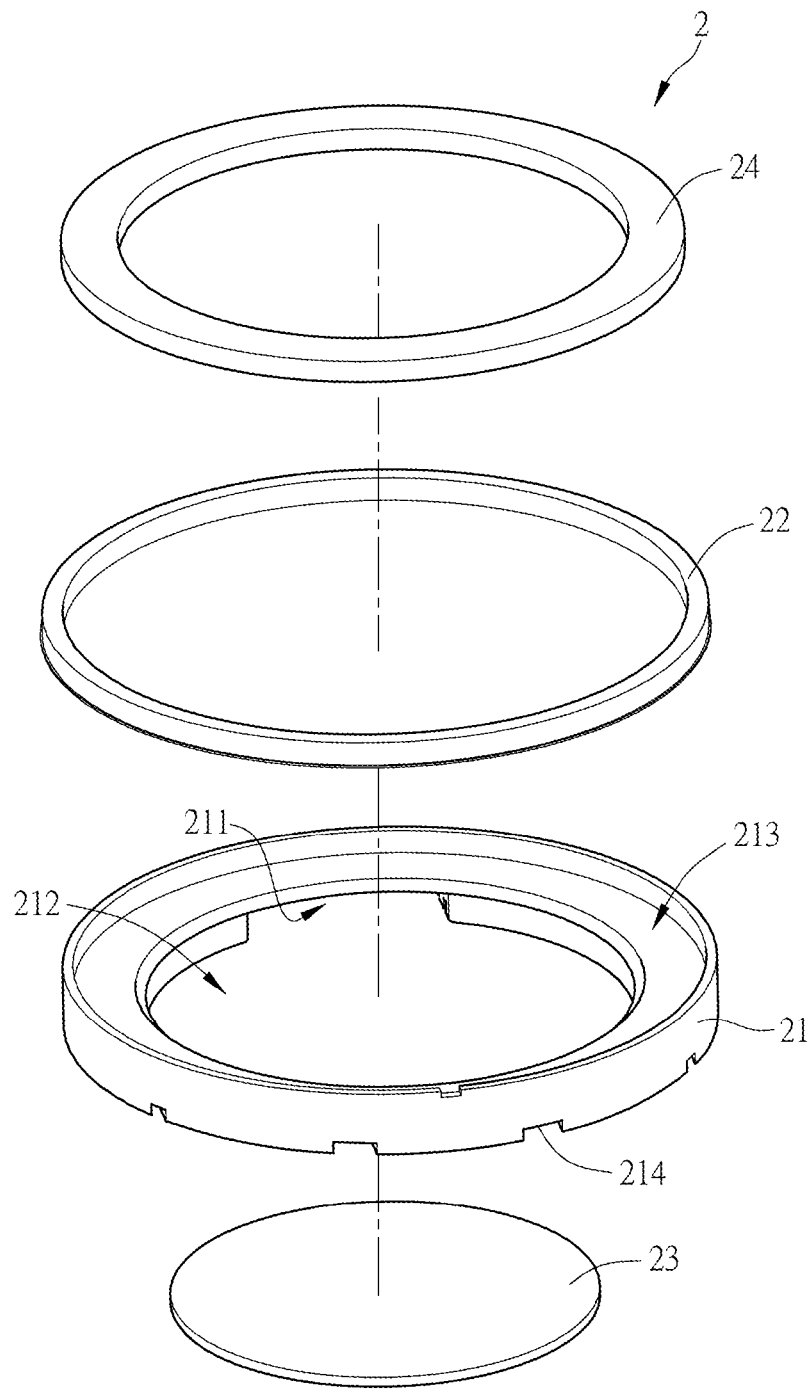
FIG. 2A is an exploded view of a heat dissipating apparatus according to a first embodiment of the invention.
Figure 2B:
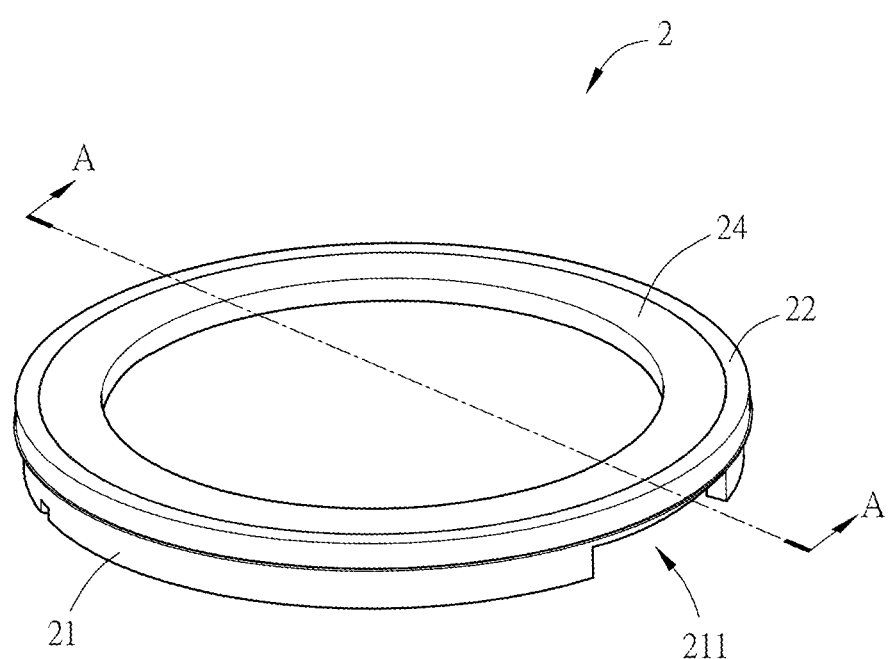
FIG. 2B is a schematic diagram of the assembled heat dissipating apparatus of FIG. 2A.
Figure 3A:
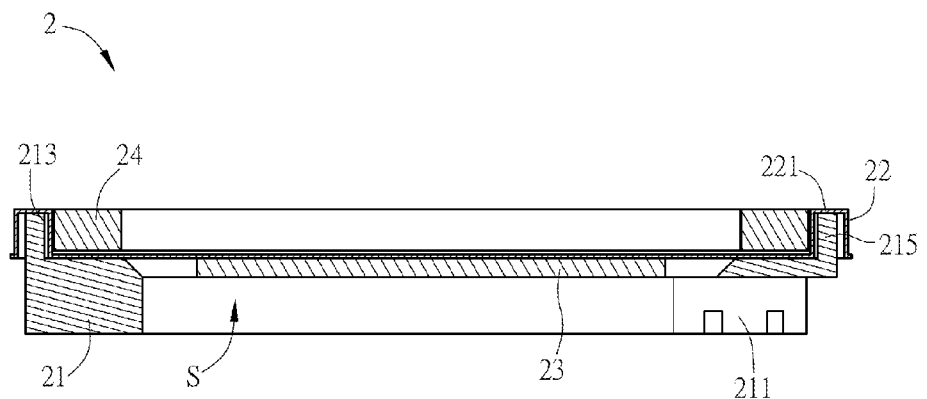
FIG. 3A is a sectional view of the heat dissipating apparatus of FIG. 2B along line A-A.

FIG. 2A is an exploded view of a heat dissipating apparatus according to a first embodiment of the invention, FIG. 2B is a schematic diagram of the assembled heat dissipating apparatus of FIG. 2A, and FIG. 3A is a sectional view of the heat dissipating apparatus of FIG. 2B along line A-A. With reference to FIGS. 2A, 2B and 3A, a heat dissipating apparatus 2 of the invention includes a frame 21, an elastic body 22, a magnetic member 23 and a coil 24. The frame 21 has an opening 211 and a chamber 212, and the elastic body 22 is disposed in on the frame 21 corresponding to the chamber 212. Accordingly, the frame 21 and the elastic body 22 define a space S together (see FIG. 3A). The magnetic member 23 is located corresponding to the space S and disposed at one side of the elastic body 22. The coil 24 is located corresponding to the periphery of the space S and disposed on the frame 21. Preferably, the frame 21 has a recess 213 and the coil 24 is disposed in the recess 213. In other words, the position of the magnetic member 23 corresponds to the space S defined by the frame 2 1and the elastic body 22, and the coil 24 is positioned in the recess 213 and at the periphery of the space S. As a result, the magnetic member 23 and the coil 24 are arranged alternately, which can effectively use the available space and thus achieve the flat and minimization design of the heat dissipating apparatus 2.

Figure 3B:
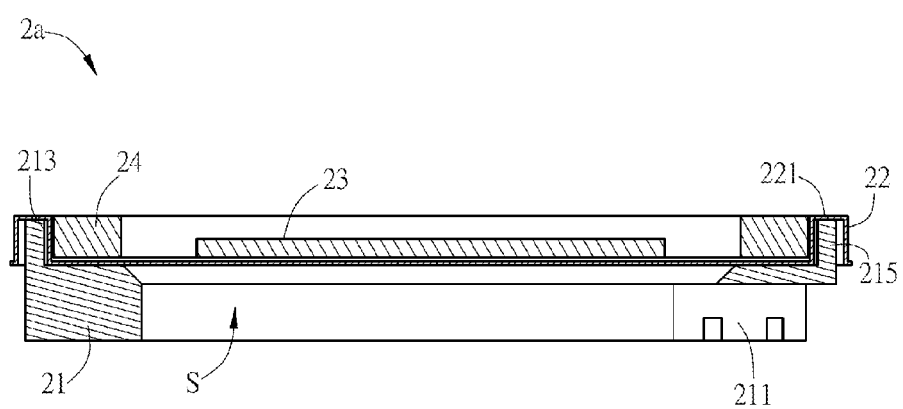
FIG. 3B is a schematic diagram showing another type of the heat dissipating apparatus of FIG. 3A.

The elastic body 22 is telescoped to the periphery of the frame 21. In this embodiment, the coil 24 is configured at the inner side of the elastic body 22. Alternatively, the coil can be located at the outer side of the elastic body (see FIG. 11B). Moreover, the magnetic member 23 and the coil 24 are located at two opposite sides of the elastic body 22. Alternatively, as shown in FIG. 3B, the magnetic member 23 and the coil 24 of the heat dissipating apparatus 2a are located at the same side of the elastic body 22. To be noted, any design allows the alternate arrangement of the magnetic member 23 and the coil 24 for achieving the flat structure of the heat dissipating apparatus is applicable, and this invention is not limited thereto. Based on the arrangement and design of the magnetic member 23 and the coil 24 of the invention, the height of the heat dissipating apparatus 2 can be smaller than 4 mm, and preferably smaller than 3 mm.

Figure 4A:
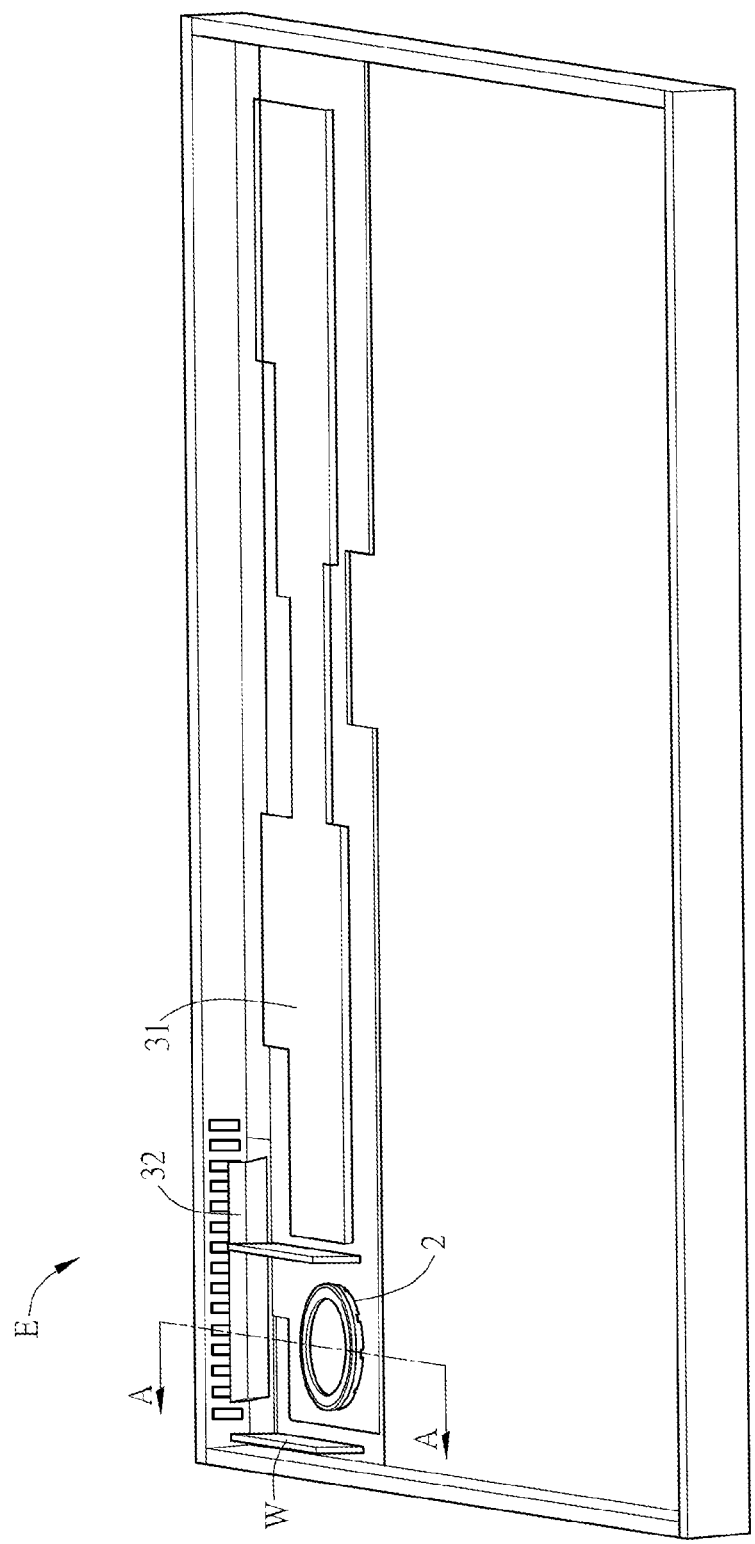
FIG. 4A is a schematic diagram showing the heat dissipating apparatus of FIG. 3A applied to an electronic device.
Figure 4B:
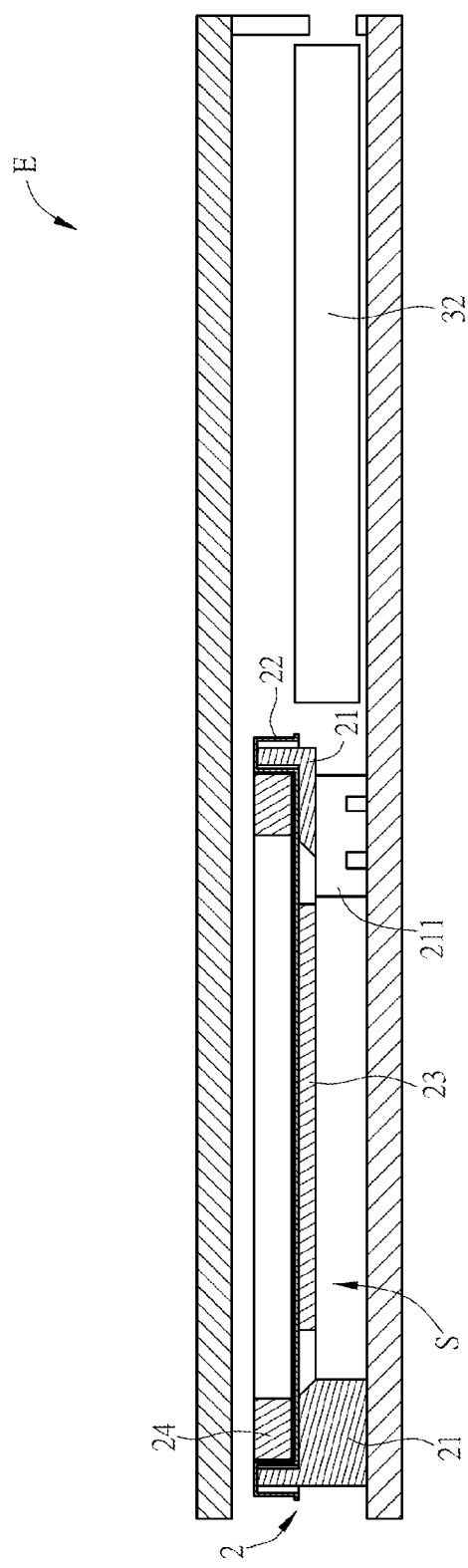
FIG. 4B is a sectional view of the heat dissipating apparatus of FIG. 3A applied to an electronic device along a line A-A.

FIG. 4A is a schematic diagram showing the heat dissipating apparatus of FIG. 3A applied to an electronic device, and FIG. 4B is a sectional view of the heat dissipating apparatus of FIG. 4A along a line A-A. Herein, the upper cap of the housing of the electronic device is omitted in FIG. 4A in order to make the figure more clean. Referring to FIGS. 4A and 4B, the heat dissipating apparatus 2 is equipped in an electronic device E and is installed adjacent to the heat source 31. The heat source 31 is connected with the thermal conductive module 32, so that it is possible to transmit the heat generated by the heat source 31 to the thermal conductive module 32 (such as a heat sink). When the heat dissipating apparatus 2 is installed in the electronic device E, the frame 21 and the housing of the electronic device E form an enclosed space (the space S), which communicates with the exterior through the opening 211. Of course, except the electronic device, the heat dissipating apparatus 2 can also be applied to other small-sized devices requiring heat dissipation such as an LED lamp.

In addition, the coil 24 can be connected with a conductive wire (not shown). Accordingly, the magnetic member 23 can be driven by the electromagnetic force induced as current flows through the coil 24, thereby carrying the elastic body 22 to move back and forth. Since the elastic body 22 is flexible and can define the enclosed space S along with the electronic device E, the back-and-forth motion of the elastic body 22 will cause the compression and enlargement of the space S, thereby driving the air inside the space S to flow. As a result, the air can be guided toward the thermal conductive module 32 or the heat source 31 for heat dissipation. As shown in FIG. 4A, two walls W can be configured at the periphery of the heat dissipating apparatus 2 to define a flow path for limiting the air to flow toward the thermal conductive module 32 or the heat source 31. This configuration can speed the heat dissipation of the electronic device E.

Figure 4C:
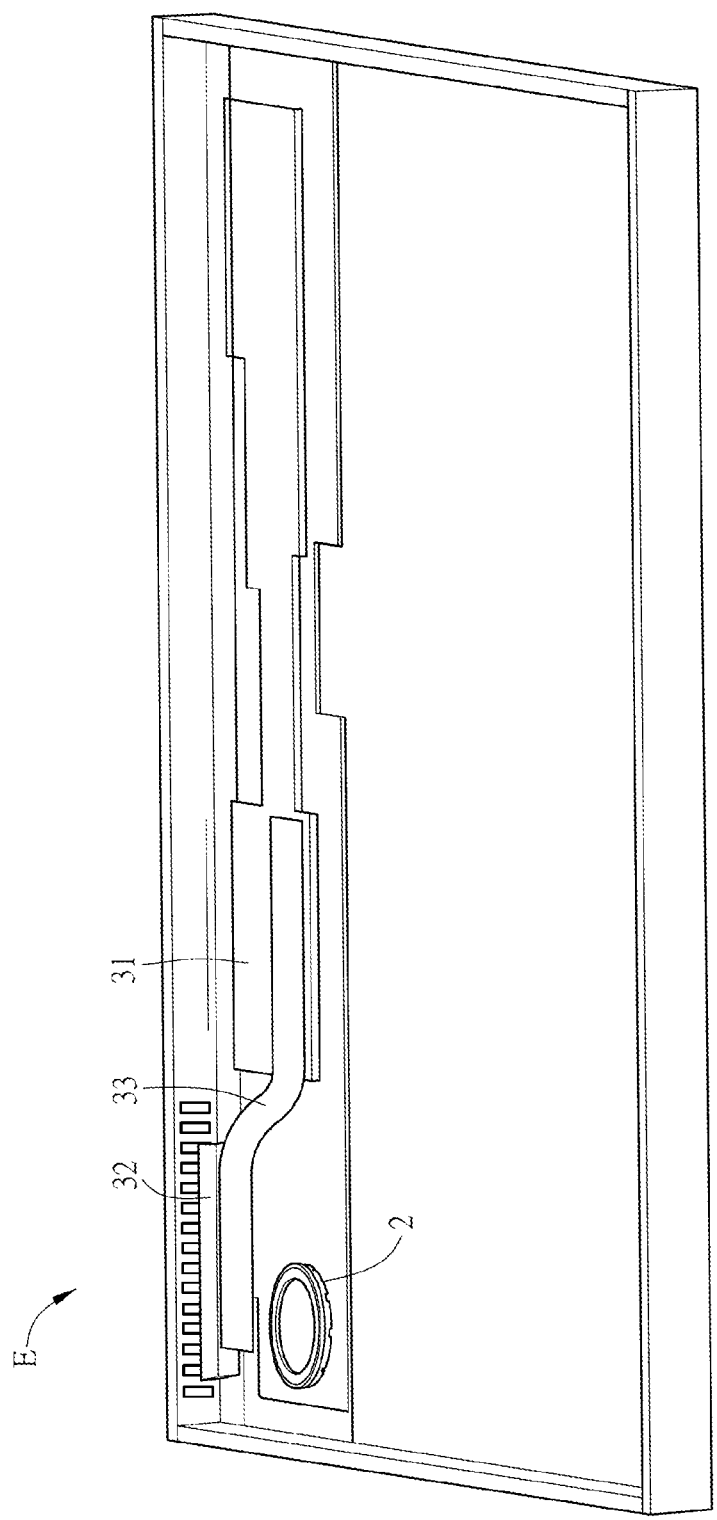
FIG. 4C is a schematic diagram showing another aspect of the heat dissipating apparatus of FIG. 3A applied to another type of the electronic device.

In other embodiments, the electronic device E further includes a heat pipe 33 as shown in FIG. 4C. The heat pipe 33 is connected with the heat source 31 so that the heat generated by the heat source 31 is transmitted to the thermal conductive module 32 through the heat pipe 33. Afterwards, the air formed by the vibration of the heat dissipating apparatus 2 can dissipate the heat accumulated in the thermal conductive module 32. The function of the heat dissipating apparatus 2 will be described in more detail hereinafter.

Figure 5:
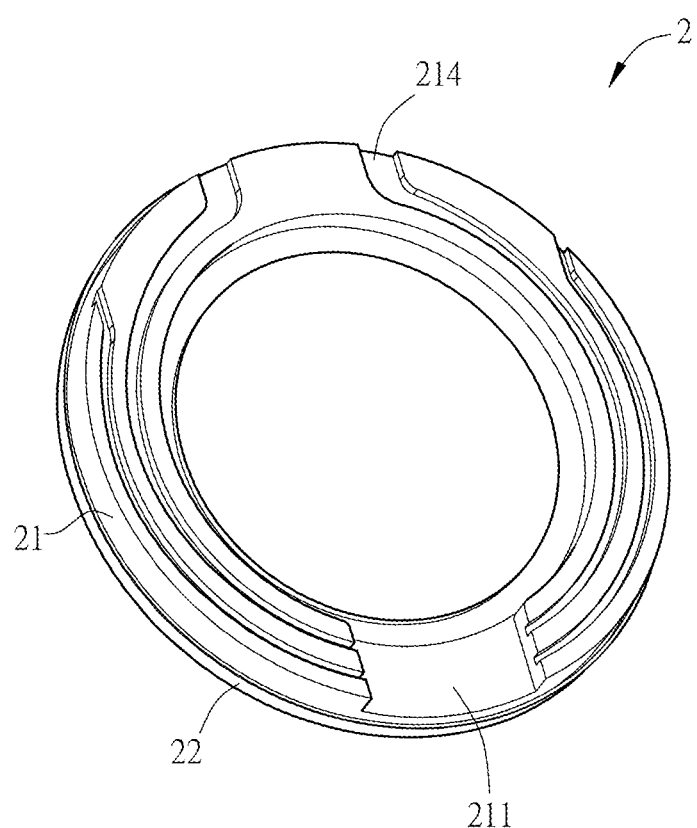
FIG. 5 is a schematic diagram of the heat dissipating apparatus of FIG. 2B viewed from another direction.
Figure 6A:
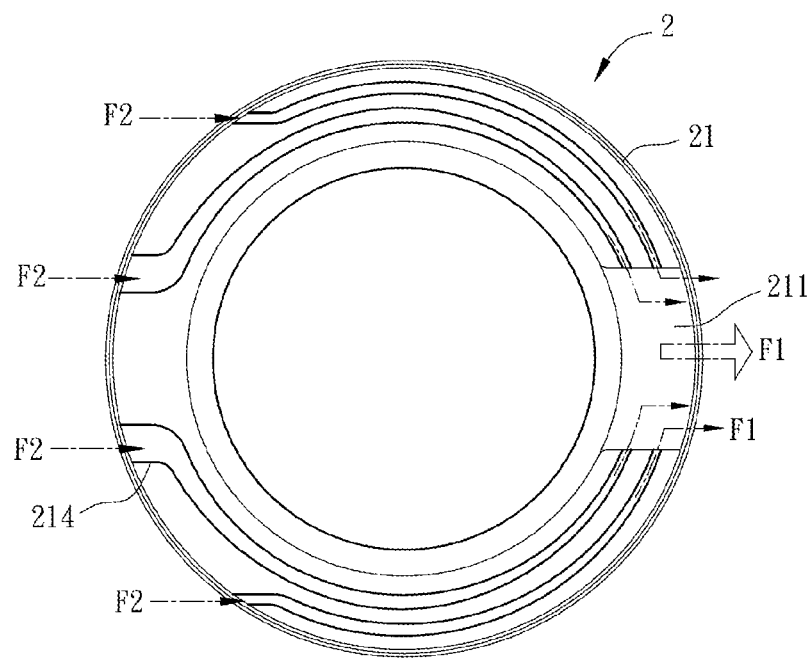
FIG. 6A is a schematic diagram showing the heat dissipating apparatus of FIG. 5 when the airflow is exhausted.
Figure 6B:
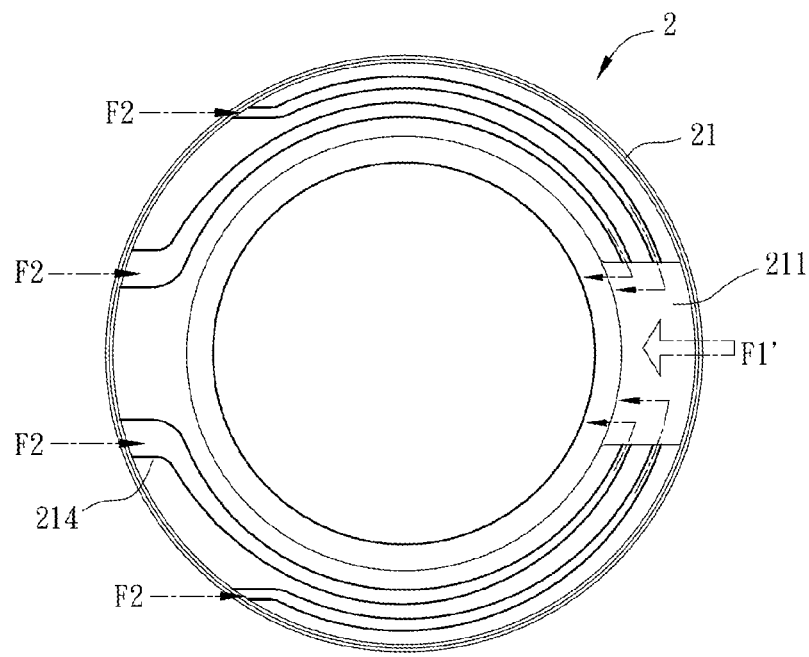
FIG. 6B is a schematic diagram showing the heat dissipating apparatus of FIG. 5 when the airflow is inspired.

FIG. 5 is a schematic diagram of the heat dissipating apparatus of FIG. 2B viewed from another direction. Preferably, as shown in FIG. 5, the frame 21 further includes at least one channel 214, which is communicated with the opening 211. FIG. 6A is a schematic diagram showing the heat dissipating apparatus of FIG. 5, when the air is exhausted, and FIG. 6B is a schematic diagram showing the heat dissipating apparatus of FIG. 5 when the air is inspired. Referring to FIGS. 6A and 6B in view of FIG. 4, when the space S is compressed and thus becomes smaller, the air originally existed in the space S is pushed and forced to flow out. Accordingly, an airflow F1 is generated at the opening 211 of the heat dissipating apparatus 2 (see FIG. 6A). Alternatively, when the space S is enlarged, the air pressure in the space S decreases so that another airflow F1' entering the space S is induced (see FIG. 6B). As a result, the elastic body 22 will vibrate back and forth so as to drive the air around the heat dissipating apparatus 2 to flow. Moreover, it is possible to adjust the vibration direction of the elastic body 22 to optionally guide external air to blow toward the thermal conductive module 32 or the heat source 31.

In addition, when the magnetic member 23 is driven by the induced electromagnetic force, the elastic body 22 is carried to move back and forth. The air around the opening 211 can be affected by the airflow F1, and the opposite side of the opening 211, which is the open end of the channel 214 (see FIGS. 6A and 6B) communicated with the opening 211, will generate another airflow F2. The airflow F2 enters the heat dissipating apparatus 2 through the open end of the channel 214 and then flows to the opening 211. Afterwards, the airflow F2 is merged with the airflow F1 (or airflow F1') at the opening 211, and then the merged airflow blows toward the thermal conductive module 32 electronic device (or is guided to the space S). In other words, the air around the open end of the channel 214 will be simultaneously affected so that the airflow around the heat dissipating apparatus 2 has better flowing condition.

Referring to FIGS. 7A and 7B, in other embodiments, when the heat dissipating apparatus 2 is installed in the electronic device E, the housing of the electronic device E can be further designed with a hole O, which is located corresponding to the opening 211. When the space S is compressed (as the downward arrow shown in FIG. 7A) or enlarged (as the upward arrow shown in FIG. 7B), the air pressure around the opening 211 will be changed thereby driving the external airflow F3 from outside of the electronic device E as well as the airflow F1 from the opening 211 to flow toward the thermal conductive module 32 electronic device (see FIG. 7A). Otherwise, the external airflow F3 can flow along with the airflow F1' introduced from the opening 211 into the space S (see FIG. 7B). Accordingly, a better heat dissipation effect can be achieved due to the introduced external air. The dual-directional airflows F1 and F1' may be applied to other embodiments. Moreover, it is possible to provide a check valve or non-return valve (see FIG. 11C) at the opening 211 so that the airflow direction at the opening 211 can be controlled to one way only such as either the output airflow F1 or the input airflow F1'.

Figure 8A:
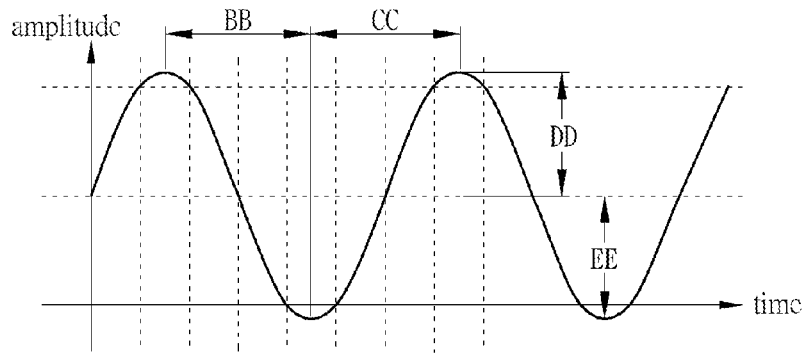
FIGS. 8A to 8C are waveform diagrams showing the signals for controlling the elastic body and the magnetic member of FIG. 3A.
Figure 8B:
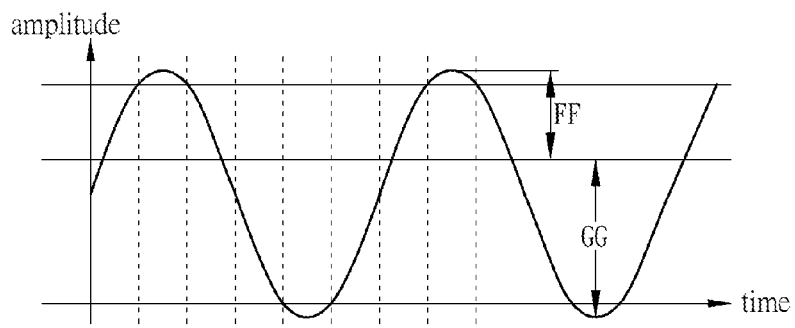
Figure 8C:
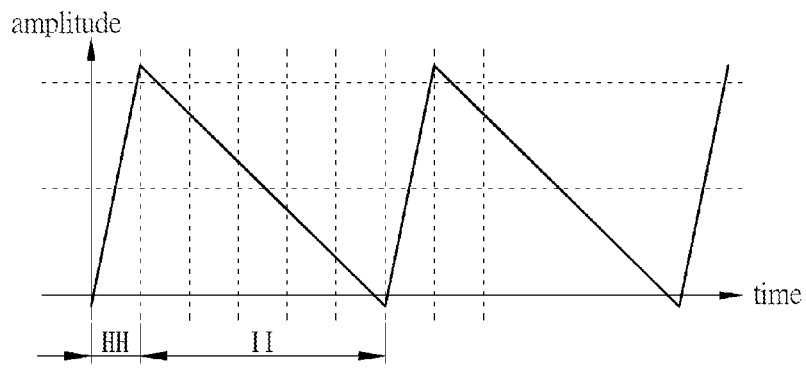

FIGS. 8A to 8C are waveform diagrams showing the signals for controlling the elastic body and the magnetic member of FIG. 3A. The signals with specific waveforms can be outputted to the coil 24 by adjusting the voltage value or the current frequency. In this case, the applied voltage value ranges between 2 and 6 volts, preferably between 3 and 5 volts. The current frequency is lower than 150 Hz, preferably between 20 and 80 Hz. In this embodiment, the voltage value is controlled between 3 and 5 volts to output the signal with specific waveform to the coil 24. The generated waveform is, for example but not limited to, a sine wave, a square wave or a triangle wave. After induction, the magnetic member 23 can carry the elastic body 22 to generate desired amplitude as the specific waveform (as shown in FIGS. 8A to 8C). As shown in FIG. 8A, the outputted waveform is a regular sine wave, wherein the cycle time of the upper sine wave portion (B-B) is the same as that of the lower sine wave portion (C-C). That is, the speed of the output airflow F1 is the same as that of the input airflow F1'. In addition, the amplitude of the upper sine wave portion (D-D) is the same as that of the lower sine wave portion (E-E), which means that the air volume of the output airflow F1 is the same as that of the input airflow F1'. As shown in FIG. 8B, the amplitude of the upper sine wave portion (F-F) is smaller than that of the lower sine wave portion (G-G) so that the air volume of the output airflow F1 is the smaller than that of the input airflow F1', thereby achieving different air disturbances.

As shown in FIG. 8C, the cycle time of the upper wave portion (H-H) is obviously smaller than that of the lower wave portion (I-I), which means that the airflow F1 is outputted within a short time period so that speed of the output airflow F1 is faster while the inputted airflow F1' is slower. That is, the vibration is carried out in a fast-lift-slow-descend approach. As a result, the airflow F1 is outputted rapidly while the airflow F1' is inputted slowly. Accordingly, the heat dissipating apparatus 2 of the invention can generate various airflows based on the size of the space S as well as controlling the voltage value or the current frequency to output signals with specific waveforms to the coil 24 for inducing the magnetic member 23 to move the elastic body 22 with different amplitudes. Since the invention utilizes electrical signal to generate the desired airflow, the undesired noise can be avoided. Moreover, the vibration point is directly activated, so the power consumption can be minimized. That is, the elastic body 22 and magnetic member 23 can be motivated by smaller voltage or current (lower power consumption).

Figure 9:
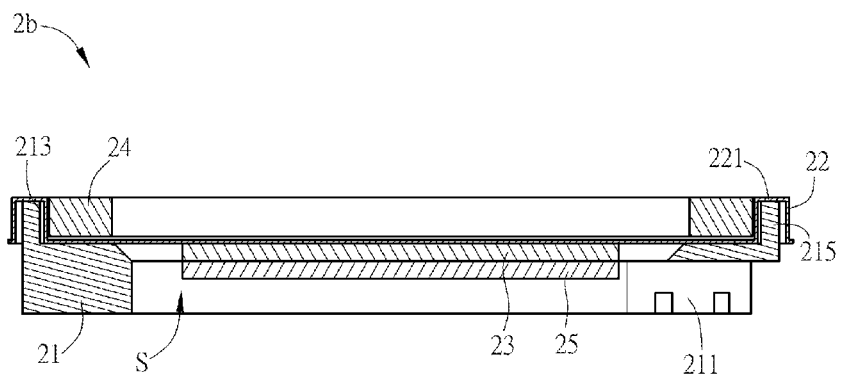
FIG. 9 is a schematic diagram showing another type of the heat dissipating apparatus of FIG. 3A.

Except the method of adjusting the signals with specific waveforms, the vibration and amplitude of the elastic body 22 can also be controlled by other approaches such as adding a weighting member 25 on the magnetic member 23 or adopting the composite material for the elastic body 22. FIG. 9 is a schematic diagram showing another type of the heat dissipating apparatus. In more detailed with reference to FIG. 9, a heat dissipating apparatus 2b further includes a weighting member 25 disposed at one side of the magnetic member 23. When the magnetic member 23 drives the elastic body 22 to vibrate, the configuration of the weighting member 25 can increase the total weight of the vibrating object so as to make the elastic body 22 generate larger amplitude. In other embodiments that the magnetic member 23 is smaller, the weighting member 25 can be attached to the periphery of the magnetic member 23 for increasing the total weight of the vibrating object including the elastic body 22 and the magnetic member 23. Besides, this approach can increase the attaching area of the magnetic member 23 on the elastic body 22 so that the vibration of the elastic body 22 can be smoother. Otherwise, if the elastic body 22 is made of composite material (not shown), the smoother vibration can also be achieved. For example, a portion of the elastic body 22 close to the center of the magnetic member 23 is made of a material with higher elastic coefficient (or harder material), while another portion of the elastic body 22 close to the periphery of the magnetic member 23 is made of a material with lower elastic coefficient (or softer material). Accordingly, the elastic body 22 is made of a composite material with different elastic coefficients. Herein, the elastic body 22 can be, for example but not limited to, a natural latex film with different elastic coefficients.

Figure 10:
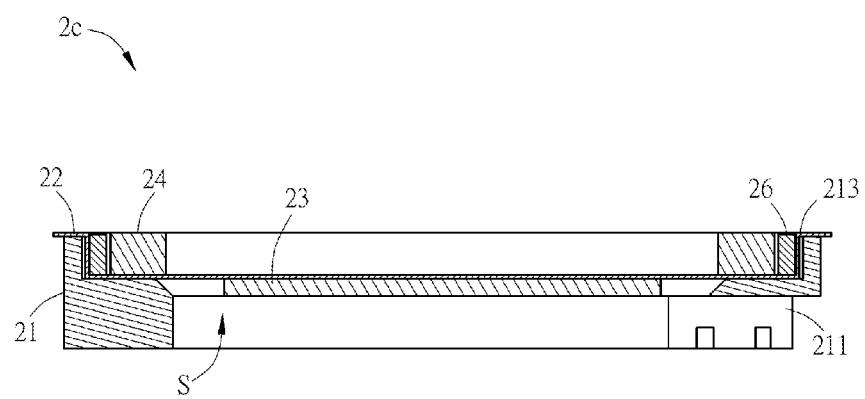
FIG. 10 is a schematic diagram showing further another type of the heat dissipating apparatus of FIG. 3A.

Besides, if the elastic body 22 and the frame 21 are perfectly sealed, the airflow F1 and F1' (see FIGS. 7A and 7B) can be ensured to be outputted or inputted through the opening 211 instead of leaking from the connection between the elastic body 22 and the frame 21. In this embodiment, as shown in FIG. 3A, the frame 21 has a protruding portion 215, and the elastic body 22 has a concave portion 221. The protruding portion 215 is fitted to the concave portion 221 so as to form a sealed structure. To be noted, the protruding portion 215 and the concave portion 221 are for illustration only, and the invention is not limited thereto. For example, the cross section of the protruding portion 215 can have a shape of square, arc, triangle, or other polygons. The concave portion 221 has a shape corresponding to the protruding portion 215, and this invention is not limited thereto. FIG. 10 is a schematic diagram showing another type of the heat dissipating apparatus. In other embodiments, as shown in FIG. 10, a heat dissipating apparatus 2c can further include a fixing member 26 for fixing the elastic body 22 on the frame 21. In this case, the fixing member 26 and the coil 24 are both disposed in the recess 213, wherein the fixing member 26 is located close to the inner wall of the recess 213. Preferably, the fixing member 26 is a flexible concentric ring, and the diameter of the fixing member 26 is slightly larger than that of the recess 213. During the assembling procedure, the fixing member 26 is pressed into the recess 213, and the flexible fixing member 26 can contact against the inner wall of the recess 213 and thus be fixed. In this embodiment, the coil 24 is configured at inner side of the elastic body 22.

Figure 11A:
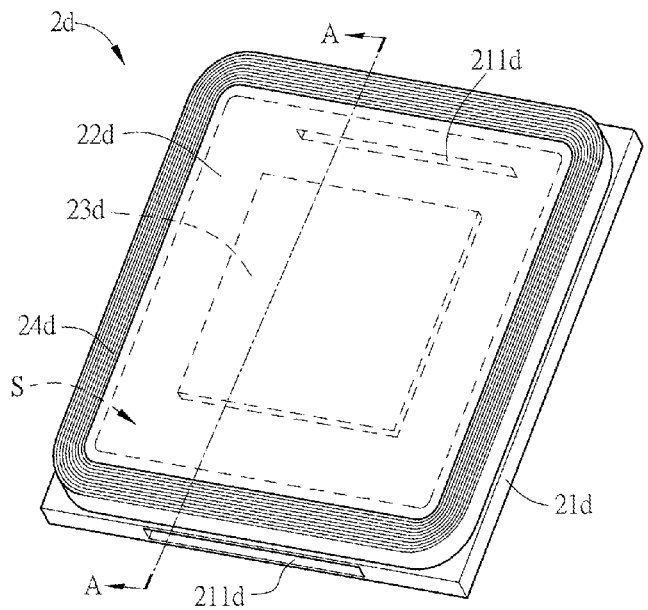
FIG. 11A is a schematic diagram showing another type of the heat dissipating apparatus of FIG. 2A.
Figure 11B:
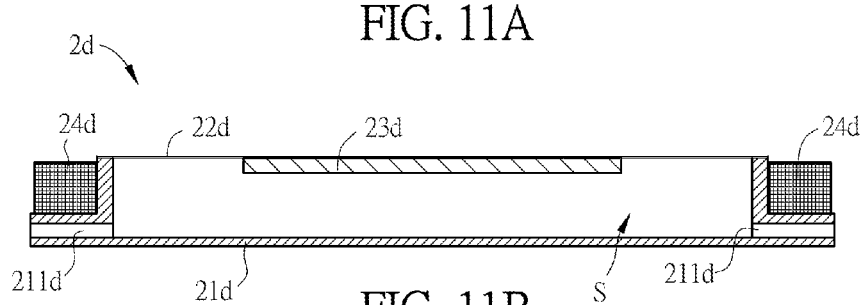
FIG. 11B is a sectional view of the heat dissipating apparatus of FIG. 11A along a line A-A.
Figure 11C:
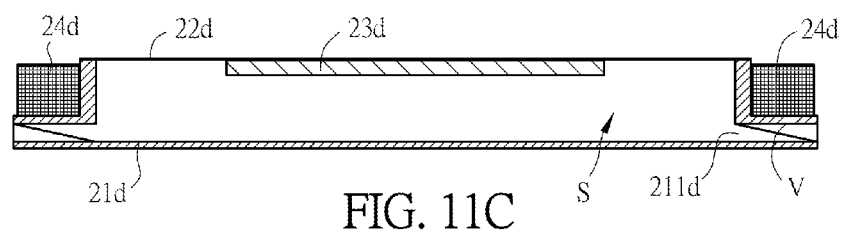
FIG. 11C is a schematic diagram showing another type of the heat dissipating apparatus of FIG. 11A.

In addition, the profile of the heat dissipating apparatus of the invention is not limited. For example, the heat dissipating apparatus 2d can be a polygonal structure. FIG. 11A is a schematic diagram showing another type of the heat dissipating apparatus of FIG. 2A, and FIG. 11B is a sectional view of the heat dissipating apparatus of FIG. 11A along a line A-A. With reference to FIGS. 11A and 11B, the heat dissipating apparatus 2d has a square frame 21d, and the frame 21d having an opening 211d, and the elastic body 22d form a space S. The magnetic member 23d is located corresponding to the space S and disposed at one side of the elastic body 22d. The coil 24d is located corresponding to the periphery of the space S and disposed on the frame 21d. Accordingly, the coil 24d and the magnetic member 23d are arranged alternately. In this embodiment, as shown in FIG. 11B, the periphery of the frame 21d is an L-shaped structure, and the coil 24d is located at the outer side of the elastic body 22d. In addition, FIG. 11C is a schematic diagram showing another type of the heat dissipating apparatus. In this case, a non-return valve V is added to the opening 211d so that the airflow at the opening 211d can be controlled in one direction only.

Figure 12A:
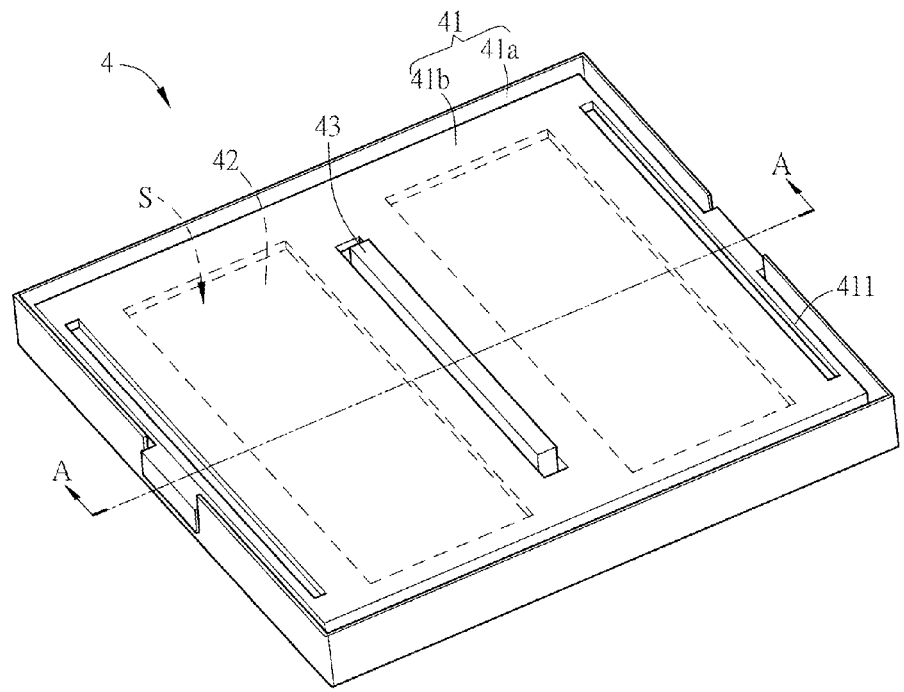
FIG. 12A is a schematic diagram showing a heat dissipating apparatus according to a second embodiment of the invention.
Figure 12B:
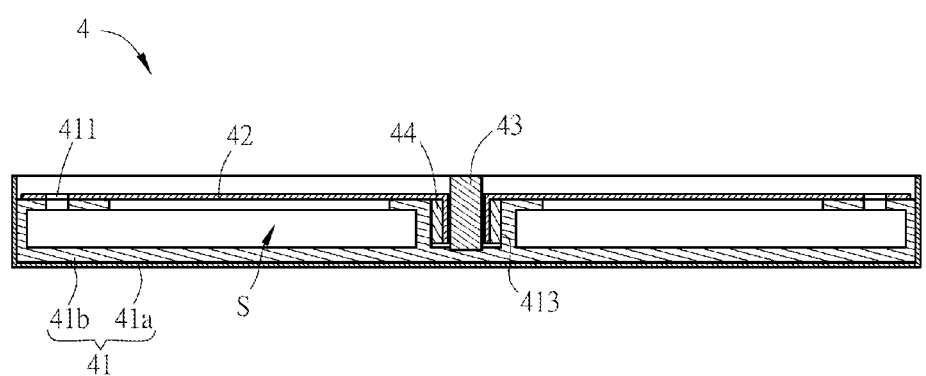
FIG. 12B is a sectional view of the heat dissipating apparatus of FIG. 12A along line A-A.

FIG. 12A is a schematic diagram showing a heat dissipating apparatus according to a second embodiment of the invention, and FIG. 12B is a sectional view of the heat dissipating apparatus of FIG. 12B along line A-A. Referring to FIGS. 12A and 12B, a heat dissipating apparatus 4 includes a frame 41, an elastic body 42, a magnetic member 43 and at least one coil 44. Similarly, the magnetic member 43 and the coil 44 are arranged alternately so that the heat dissipating apparatus 4 can be effectively flattened. In the second embodiment, the frame 41 includes an outer frame 41a and a frame body 41b, which is disposed in the outer frame 41a. The frame body 41b has an opening 411, and the elastic body 42 is disposed on the frame 41. Herein, the elastic body 42 is fixed on the frame body 41b (or the outer frame 41a) by adhering, and the frame body 41b and the elastic body 42 form a space S communicated with the opening 411. As shown in FIG. 12B, the magnetic member 43 is located corresponding to the space S and disposed at one side of the elastic body 42. The coil 44 is located corresponding to the space S and disposed at one side of the magnetic member 43.

Moreover, the frame 41 further has a recess 413, while the magnetic member 43 and the coil 44 are both disposed in the recess 413. Preferably, the coil 44 is disposed at two sides of the magnetic member 43, while one end of the elastic body 42 is located between the magnetic member 43 and the coil 44. Except the composite material of natural latex film, the elastic body 42 can be made of a general plastic film. In this embodiment, the material of the frame body 41b is elastic, so the elastic body 42 can be any general plastic film. When a current is applied to the coil 44, the magnetic member 43 induced by the electromagnetic force can drive the elastic body 42 to vibrate. The elastic property of the frame body 41b allows the increase of the vibration amplitude of the elastic body 42. The other features and connections of the components of the heat dissipating apparatus 4 (e.g. the frame body 41b has a channel communicated with the opening 411 and etc.) can be referred to the description of the heat dissipating apparatus 2 of the first embodiment, so the detailed description thereof will be omitted.

Furthermore, the structures and connections of the components of the electronic device can be referred to the electronic device or apparatus applied with the heat dissipating apparatus of the invention, so the detailed description thereof will be omitted.

In summary, the magnetic member and coil of the heat dissipating apparatus of the invention are arranged alternately so that the heat dissipating apparatus can be sufficiently flattened and minimized. Besides, the present invention can adjust the voltage value or current frequency to output signal with specific waveform to the coil according to the space and desired airflow, thereby inducing the magnetic member to drive the elastic body with various amplitudes for generating different airflows. Since the invention utilizes an electrical signal to generate the desired airflow, the undesired noise can be avoided. Moreover, the vibration point is directly activated, so the power consumption can be minimized. That is, the elastic body and magnetic member can be motivated by smaller voltage or current (lower power consumption).

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A heat dissipating apparatus, comprising:
   a frame having an opening;
   an elastic body disposed on the frame, wherein the frame and the elastic body define a space;

a coil located corresponding to the periphery of the space and disposed on the frame, and configured to induce an electromagnetic force as current flows through the coil;

a magnetic member located corresponding to the space and disposed at one side of the elastic body, and configured to carry the elastic body to vibrate back and forth when driven by the electromagnetic force induced as current flows through the coil, so as to drive an airflow to flow from inside of the frame to outside of the frame through the opening, wherein the magnetic member and the coil are disposed at two opposite side of the elastic body; and a non-return valve added to the opening so that the airflow at the opening is controlled in one direction only.

2. The heat dissipating apparatus of claim 1, wherein the magnetic member and the coil are arranged alternately.

3. The heat dissipating apparatus of claim 1, wherein the frame has at least one channel connecting to the opening.

4. The heat dissipating apparatus of claim 1, further comprising:

a weighting member disposed on the magnetic member.

5. The heat dissipating apparatus of claim 1, wherein the elastic member comprises a composite material with different elastic coefficients.

6. The heat dissipating apparatus of claim 5, wherein a portion of the elastic body close to a center of the magnetic member is made of a material with a higher elastic coefficient, and another portion of the elastic body close to the periphery of the magnetic member is made of a material with a lower elastic coefficient.

7. The heat dissipating apparatus of claim 5, wherein the elastic body is a natural latex film with different elastic coefficients.

8. The heat dissipating apparatus of claim 1, wherein the elastic member is made of a general plastic film.

9. The heat dissipating apparatus of claim 1, wherein the elastic body is disposed between the frame and the coil.

10. The heat dissipating apparatus of claim 1, wherein the frame has a recess, and the coil is disposed in the recess.

11. The heat dissipating apparatus of claim 1, wherein the frame has a protruding portion, and the elastic member has a concave portion fitting to the protruding portion.

12. The heat dissipating apparatus of claim 11, further comprising a fixing member for fixing the elastic member on the frame.

13. The heat dissipating apparatus of claim 12, wherein the fixing member is a flexible concentric ring, and a diameter of the fixing member is slightly larger than that of the recess.

14. The heat dissipating apparatus of claim 1, wherein the frame comprises an outer frame and a frame body disposed in the outer frame, wherein the frame body has the opening and the elastic body is disposed on the frame body.

15. The heat dissipating apparatus of claim 1, wherein the elastic body and the magnetic member are controlled by signals with specific waveforms outputted to the coil by adjusting a voltage value or a current frequency.

16. The heat dissipating apparatus of claim 15, wherein the specific waveforms are sine waves, square waves or triangle waves.

17. The heat dissipating apparatus of claim 1, wherein a periphery of the frame is an L-shaped structure, and the coil is outside the elastic body.

18. An electronic device, comprising: a heat source; and a heat dissipating apparatus disposed adjacent to the heat source, the heat dissipating apparatus comprising: a frame having an opening; an elastic body disposed on the frame, wherein the frame and the elastic body define a space; a coil located corresponding to the periphery of the space and disposed on the frame, and configured to induce an electromagnetic force as current flows through the coil; ad a magnetic member located corresponding to the space and disposed at one side of the elastic body and configured to carry the elastic body to vibrate back and forth when driven by the electromagnetic force induced as current flows through the coil, so as to drive an airflow to flow from inside of the frame to outside of the frame through the opening, wherein the magnetic member and the coil are disposed at the one side and a second opposite side of the elastic body; and a thermal conductive module connected with the heat source to transmit the heat generated by the heat source to the thermal conductive module.

19. The electronic device of claim 18, further comprising a wall configured at the periphery of the heat dissipating apparatus to define a flow path for limiting the air to flow toward the thermal conductive module or the heat source.

20. The electronic device of claim 18, further comprising a heat pipe connected with the heat source so that the heat generated by the heat source is transmitted to the thermal conductive module through the heat pipe.

21. The electronic device of claim 18, further comprising a housing designed with a hole located corresponding to the opening.

22. An electronic device, comprising: a heat source; and a heat dissipating apparatus disposed adjacent to the heat source, the heat dissipating apparatus comprising: a frame having an opening; an elastic body disposed on the frame, wherein the frame and the elastic body define a space; a coil located corresponding to the periphery of the space and disposed on the frame, and configured to induce an electromagnetic force as current flows through the con; a magnetic member located corresponding to the space and disposed at one side of the elastic body and configured to carry the elastic body to vibrate back and forth when driven by the electromagnetic force induced as current flows through the coil, so as to drive an airflow to flow from inside of the frame to outside of the frame through the opening, wherein the magnetic member and the coil are disposed at the one side and a second opposite side of the elastic body; a housing designed with a hole located corresponding to the opening; and a check valve or non-return valve disposed at the opening so that the airflow direction at the opening is controlled to one way only.

23. The electronic device of claim 22, further comprising a thermal conductive module connected with the heat source to transmit the heat generated by the heat source to the thermal conductive module.

24. The electronic device of claim 23, further comprising a wall configured at the periphery of the heat dissipating apparatus to define a flow path for limiting the air to flow toward the thermal conductive module or the heat source.

25. The electronic device of claim 23, further comprising a heat pipe connected with the heat source so that the heat generated by the heat source is transmitted to the thermal conductive module through the heat pipe.

* * * * *